United States Patent

Hirano et al.

[11] Patent Number: 5,912,468
[45] Date of Patent: Jun. 15, 1999

[54] CHARGED PARTICLE BEAM EXPOSURE SYSTEM

[75] Inventors: Ryoichi Hirano, Yokohama; Souji Koikari, Numazu; Kazuto Matsuki, Tokyo; Shusuke Yoshitake, Yokohama; Toru Tojo, Kanagawa-ken, all of Japan

[73] Assignee: Kabushiki Kaisha Toshiba, Kawasaki, Japan

[21] Appl. No.: 08/841,762

[22] Filed: Apr. 28, 1997

[30]     Foreign Application Priority Data

May 10, 1996  [JP]  Japan ................................. 8-116387
Mar. 12, 1997  [JP]  Japan ................................. 9-057666

[51] Int. Cl.⁶ ..................................................... H01J 37/30
[52] U.S. Cl. ..................... 250/492.2; 250/398; 250/310
[58] Field of Search ............................... 250/310, 396 R, 250/397, 398, 492.2

[56]            References Cited

U.S. PATENT DOCUMENTS

| | | | |
|---|---|---|---|
| 3,736,422 | 5/1973 | Weber et al. | 250/399 |
| 4,408,126 | 10/1983 | Tojo et al. | 250/442.11 |
| 5,270,990 | 12/1993 | Mizasawa et al. | 369/43 |
| 5,387,793 | 2/1995 | Sato et al. | 250/310 |
| 5,420,433 | 5/1995 | Oae et al. | 250/398 |
| 5,668,372 | 9/1997 | Iwabuchi et al. | 250/310 |

FOREIGN PATENT DOCUMENTS 5-347242  12/1993  Japan .
7-114182  12/1995  Japan .

OTHER PUBLICATIONS

SPIE, 11th Annual BACUS Symposium on Photomask Technology, 1991, vol. 1604, pp. 36–44, Maris A. Sturans, et al., "Positional Errors Due to Substrate Charging in E–Beam Lithography Tools".

*Primary Examiner*—Bruce Anderson
*Attorney, Agent, or Firm*—Oblon, Spivak, McClelland, Maier & Neustadt, P.C.

[57]            ABSTRACT

An object of the present invention is to provide a charged particle exposure system which can prevent the shift of an orbit of an electron beam in the vicinity of a periphery of a substrate when drawing a pattern onto the substrate, thereby making it possible to draw the pattern with high accuracy. According to the present invention, there is provided a charged particle beam exposure system comprising a holder for holding a substrate, a beam source for emitting a charged particle beam onto a surface of the substrate, beam scanning means for scanning the charged particle beam to draw a pattern on the surface of the substrate, a first electrical conductive block coming in electrical contact with a surface of a peripheral portion of the substrate, a first DC power supply unit for supplying an arbitrary voltage to the first electrical conductive block, a second electrical conductive block arranged to cover upside of the first electrical conductive block and upside of a peripheral portion along the periphery of the substrate, and to be electrically insulated from the substrate, and a second DC power supply unit for supplying the other arbitrary voltage to the second electrical conductive block.

10 Claims, 5 Drawing Sheets

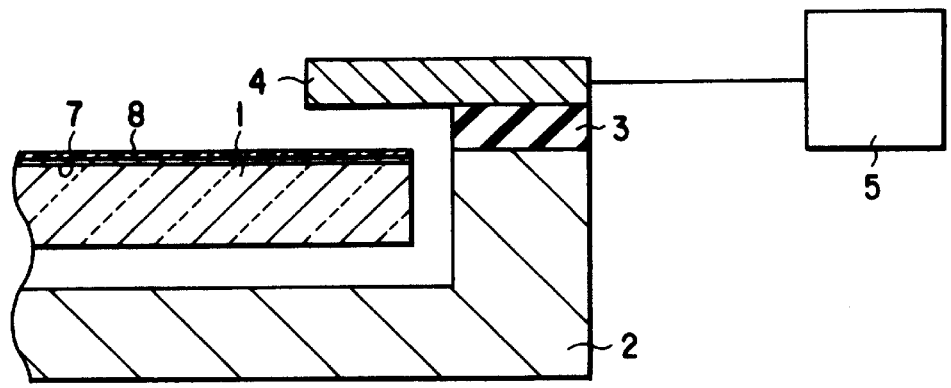
F I G. 1
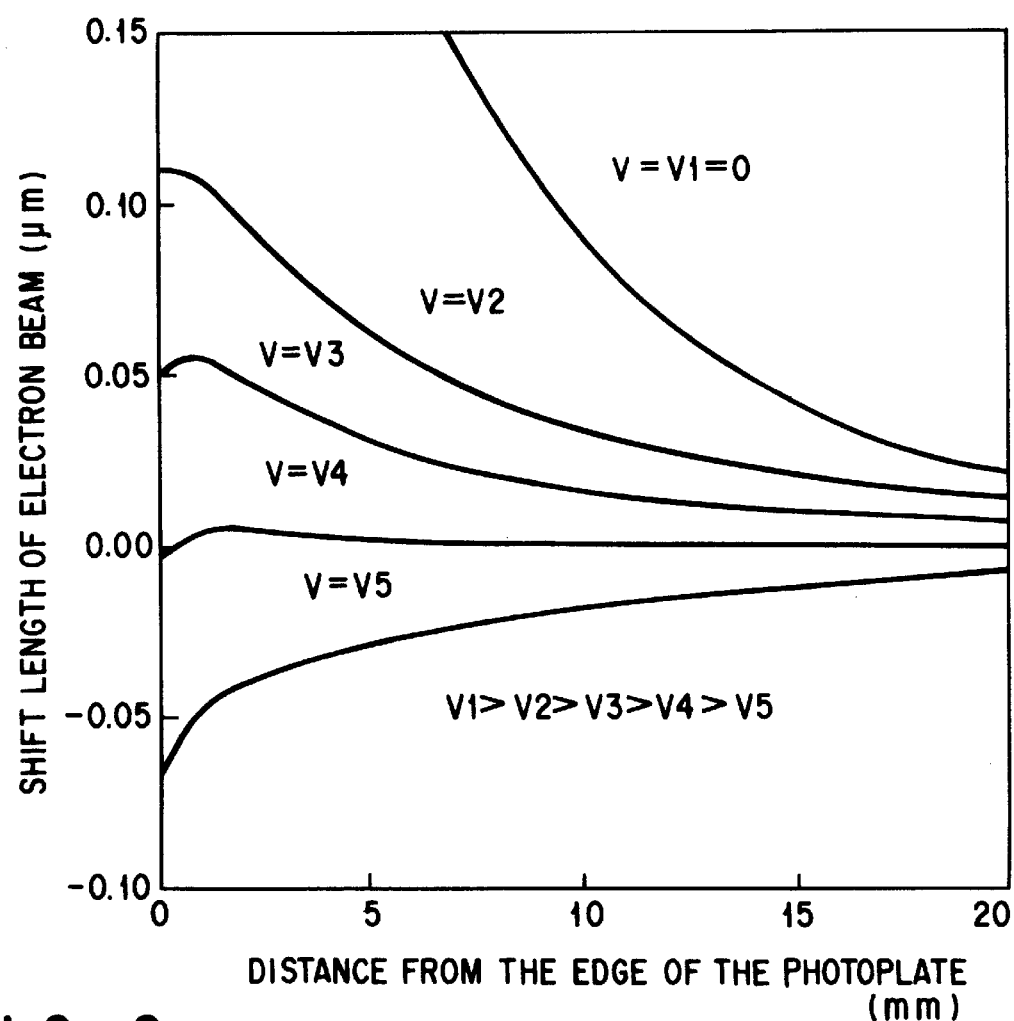
F I G. 2

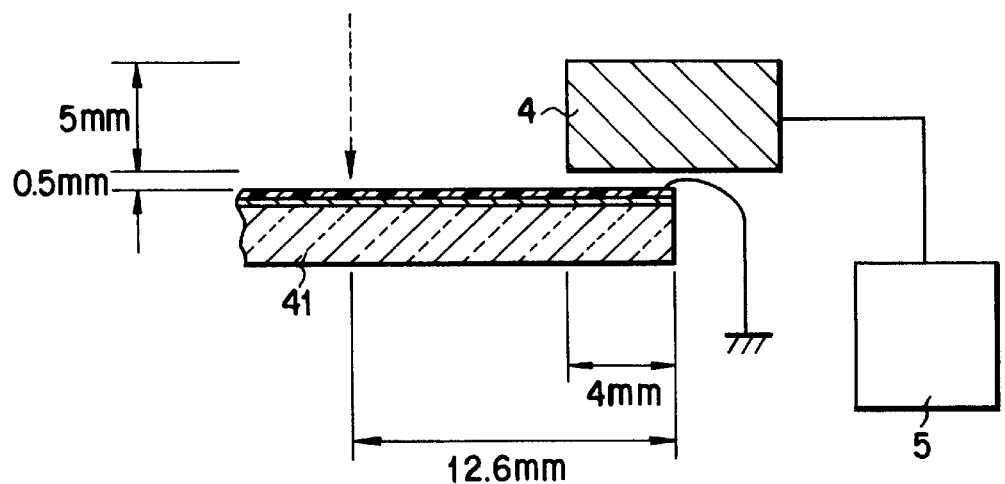
F I G. 3
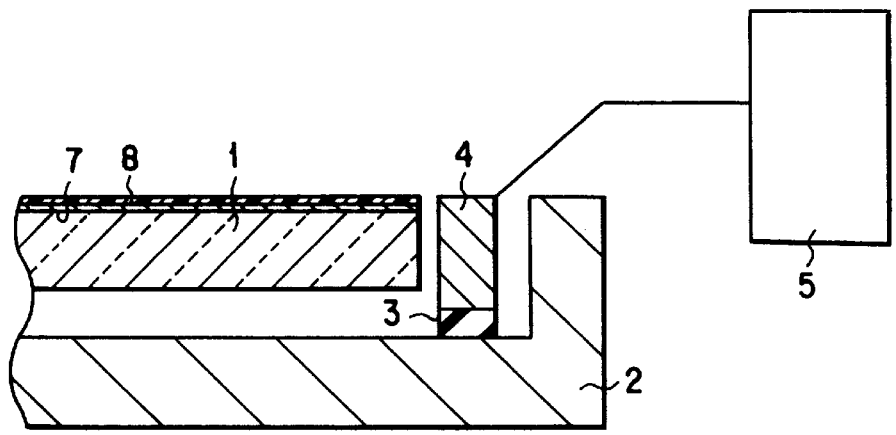
F I G. 4
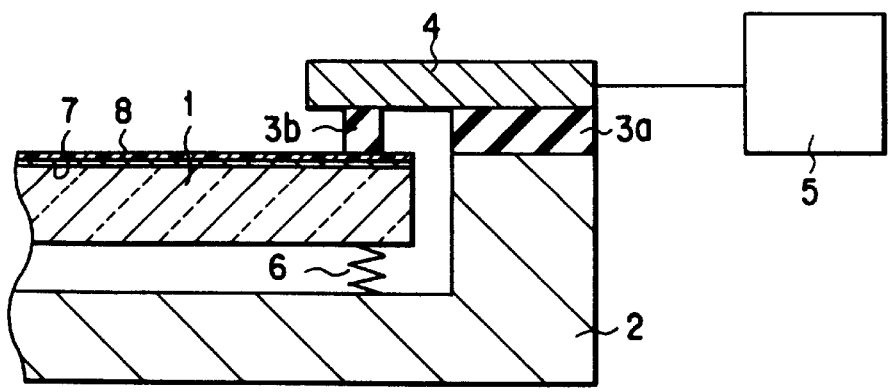
F I G. 5

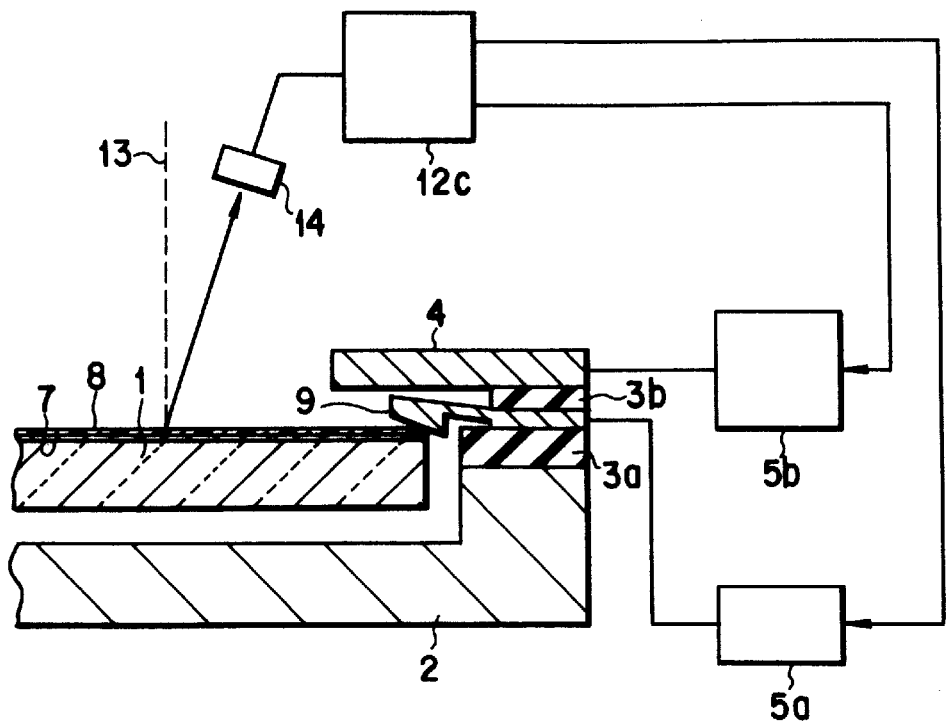
F I G. 9
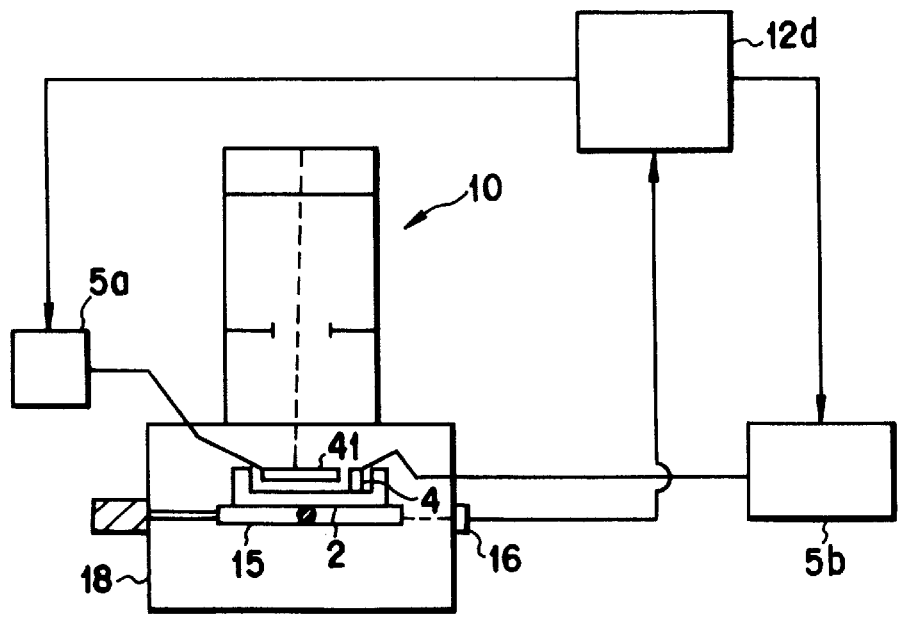
F I G. 10

CHARGED PARTICLE BEAM EXPOSURE SYSTEM

BACKGROUND OF THE INVENTION

The present invention relates to a charged particle beam exposure system for drawing a pattern on a surface of a substrate by use of a charged particle beam such an electron beam.

In accordance with the high integration of a semiconductor device (LSI) and the enlargement of the capacity, a width of a line to be used in a circuit pattern of the semiconductor device becomes narrower. In the manufacture of such a type of the semiconductor device, there are used several tens kinds of reticles (photomasks) on which various original patterns are formed. After the reticle is positioned to a wafer with high accuracy, the original pattern is transferred to an exposure region of a surface of the wafer. This process is repeated by use of the respective kinds of reticles, sequentially, so that the semiconductor device is manufactured.

For transferring the original pattern formed on the reticle, there is used a reduction projection aligner having a high accurate optical system and a high accurate XY stage. The wafer is set on the XY stage, and the entire surface of the wafer is exposed. This kind of reduction projection aligner is called a stepper since the wafer is exposed against the optical system by step and repeat.

Generally, the original pattern is drawn on a glass substrate finished with high accuracy as follows:

A Cr film is deposited on one surface of the glass substrate, and the resultant surface is uniformly coated with photoresist. The photoresist is irradiated with an electron beam so as to draw a pattern. At the time of drawing the pattern on the photoresist, an electron beam exposure system is used. In the electron beam exposure system, the photoresist is irradiated with a focused electron beam as being scanning over the entire surface of the substrate in accordance with design data. A part of photoresist where the electron beam is irradiated is changed in quality. Then, the above part of photoresist is developed, so that the pattern of photoresist is obtained. In the electron beam exposure system, since there is used the focused electron beam having high resolution, the pattern of photo-resist having high accuracy of the position can be obtained. Then, the above-formed pattern of photoresist is used as an etching mask, and the Cr film is etched. As a result, there can be obtained the original pattern, which is formed of the Cr film.

In the case of exposing the surface of the wafer by use of the original pattern formed on the glass substrate by the stepper, it was considered that it was impossible to set the resolution of the pattern to be less than 1 $\mu$m, because of the limitation of the pattern due to the wavelength of light.

However, the pattern resolution of sub-micron can be obtained by improvement of the light source and the optical system, and the use of a phase shift method for adjusting the phase of light on the reticle.

However, since there is still the limitation of improving resolution, the occupying area of the circuit pattern, that is, the size of the semiconductor device must be increased to further improve the enlargement of the capacity of the semiconductor device and the high integration. Due to this, the following point is required at the time of forming the reticle or the photomask. The high accuracy of the position must be maintained over the largest possible area in drawing the original pattern on the glass substrate.

In accordance with fining the width of the line of the circuit pattern, the so-called direct writing method is used. In this method, high resolution of the electron beam is used. The circuit pattern is directly drawn on the wafer by the electron beam without using the original pattern. Even in such a direct writing method, the pattern must be drawn with high accuracy on the largest possible area up to the portion close to the periphery of the wafer in order to effectively use the area of the wafer surface.

In the case of the pattern-writing by use of the electron beam, the electron beam is deflected by the inclination of the electric potential and the arrival position of the beam is shifted if the electric field of the surrounding of the portion where the electron beam is irradiated is not uniform. As a result, the positional accuracy of the pattern is reduced.

The end surface of the glass substrate is not covered with the Cr deposition film. Due to this, if the electron beam is irradiated to a portion close to the periphery of the glass substrate to draw the pattern, the charge-up occurs on the end surface of the substrate by a generating secondary electron. By the occurrence of the charge-up, the electric field becomes ununiformed, and the positional accuracy of the drawing pattern is reduced. To avoid this problem, Japanese Patent Application KOKAI No. 5-347242 proposes a method in which the peripheral portion of the glass substrate is covered with an electrical conductive cover. However, since photoresist covering the Cr film is non-conductive, the electric potential of the surface of photoresist is generated by irradiation of the electron beam. As a result, an electric field is formed by the electric potential difference between the electrical conductive cover and the surface of photoresist. The electric field deflects the electron beam. As a result, there newly occurs a problem in which the positional accuracy of the pattern is reduced in the vicinity of the periphery.

BRIEF SUMMARY OF THE INVENTION

The present invention has been made to solve the above-mentioned problems. An object of the present invention is to provide a charged particle exposure system which can prevent a deflection of a charged particle beam in the vicinity of a periphery of a substrate when drawing a pattern onto the substrate by use of the charged particle beam such as the electron beam, thereby making it possible to draw the pattern with high accuracy.

According to the present invention, there is provided a charged particle beam exposure system comprising:

a holder for holding a substrate;

a beam source for emitting a charged particle beam onto a surface of the substrate;

beam scanning means for scanning the charged particle beam to draw a pattern on the surface of the substrate;

an electrical conductive block arranged in the vicinity of a periphery of the substrate to be electrically insulated from the substrate; and a DC power supply unit for supplying an arbitrary voltage to the electrical conductive block.

In the present invention, the electrical conductive block is arranged to cover upside of the peripheral portion along the periphery of the substrate, and to be attached to the holder as being electrically insulated from the holder.

Also, in the present invention, the electrical conductive block is arranged at the outer side of the periphery of the substrate along the periphery, and to be attached to the holder as being electrically insulated from the holder, and an upper surface of the electrical conductive block is positioned to have the same level as an upper surface of the substrate.

Moreover, in the present invention, the charged particle beam exposure system further comprises voltage controlling means for controlling a voltage supplied to the electrical conductive block in accordance with an irradiation condition of the charged particle beam.

Furthermore, according to the present invention, there is provided a charged particle beam exposure system comprising:

a holder for holding a substrate;

a beam source for emitting a charged particle beam onto a surface of the substrate;

beam scanning means for scanning the charged particle beam to draw a pattern on the surface of the substrate;

a first electrical conductive block coming in electrical contact with a surface of a peripheral portion of the substrate;

a first DC power supply unit for supplying an arbitrary voltage to the first electrical conductive block;

a second electrical conductive block arranged to cover upside of the first electrical conductive block and upside of a peripheral portion along the periphery of the substrate, and to be electrically insulated from the substrate; and a second DC power supply unit for supplying the other arbitrary voltage to the second electrical conductive block.

In the present invention, the first and second electrical conductive blocks are attached to the holder as being electrically insulated from the holder.

Also, in the present invention, the charged particle beam exposure system further comprises a current measurement unit for measuring a current flowing from the first electrical conductive block to the DC power supply unit; and voltage controlling means for independently controlling voltages supplied to the first and second electrical conductive blocks based on the measured value of the current by the current measurement unit.

Moreover, in the present invention, the charged particle beam exposure system further comprises measuring means for measuring energy of the charged particle beam irradiated onto the substrate; and voltage controlling means for independently controlling voltages supplied to the first and second electrical conductive blocks based on the measured value of energy of the charged particle beam by the measuring means.

Further, in the present invention, the charged particle beam exposure system further comprises a moving stage having the holder attached thereto; position measuring means for measuring a position of the moving stage; and voltage controlling means for independently controlling voltages supplied to the first and second electrical conductive blocks based on the measured value of the position of the moving stage by the measuring means.

Furthermore, the charged particle beam exposure system further comprises voltage controlling means for independently controlling voltages supplied to the first and second electrical conductive blocks in accordance with an irradiation condition of the charged particle beam.

According to the charged particle beam exposure system of the present invention, the substrate having the pattern drawn thereon is a photo plate for plotting an original pattern, or a silicon wafer for direct writing. In the use of the photo plate, a Cr film is deposited on a glass substrate, and the resultant surface is coated with a photoresist film. In the case of the silicon wafer, the silicon wafer is coated with a photoresist film. Although material of an electrical conductive block is not particularly limited, metals such as copper, aluminum can be generally used.

The voltage to be supplied to the electrical conductive block (or second electrical conductive block) is adjusted such that the electric potential in the vicinity of the surface of the substrate becomes uniform over the entire surface of the substrate and an electric potential inclination becomes parallel to a direction of the beam. The value of the voltage is changed in accordance with the level where the electrical conductive block is positioned (height from the surface of the substrate). In other words, the voltage is supplied to the electrical conductive block such that the electric potential of the peripheral portion of the substrate at the level where the electrical conductive block is positioned becomes the same as the electric potential of the central portion of the substrate.

To prevent the charge-up on the surface of the substrate, the second electrical conductive block is positioned to cover the first electrical conductive block when the electrical conductive block (first electrical conductive block) such as an earth knife is pressed onto the surface of the substrate to let the electrical charge free. Thereby, influence of ununiformity of the electric field, which is caused by the first electrical conductive block, can be removed.

Moreover, the voltages supplied to the first and second electrical conductive blocks are independently adjusted in accordance with the irradiation condition of the charged particle beam. Thereby, the shift of the electron beam at the arrival position can be minimized.

Thus, in the charged particle beam exposure system of the present invention, the electrical conductive block (or second electrical conductive block) is arranged in the vicinity of the periphery of the processing substrate, and an optimum voltage is supplied to the electrical conductive block. As a result, there can be restrained the generation of the electric field having the electric potential inclination in the direction which is not parallel to the direction of the beam at the peripheral portion of the processing substrate. Then, the electric potential of the surface of the processing substrate becomes uniform over the entire surface of the substrate, so that the deflection of the charged particle beam is prevented. Moreover, the electrical conductive block is arranged in the vicinity of the periphery of the processing substrate. As a result, the secondary electron is prevented from being incident onto a portion which is not covered with a Cr deposition film at the end surface of the processing substrate. Also, the charge-up is restrained from being generated at the end surface of the processing substrate.

The same method as explained above can be applied to an SEM (Scanning Electron Microprobe). In SEM, the electron beam is irradiated to the surface of the specimen as being scanning so that the surface of the specimen is observed based on the amount of the secondary electron generated. In the case of SEM, the electric field is generated by the difference between the central portion of the specimen and the peripheral portion in the amount of the charge-up. The orbit of the electron beam is shifted by the electric field, so that the distortion of the image occurs. To solve this problem, the electrical conductive block is arranged in the vicinity of the periphery of the specimen, and an optimum voltage is applied to the electrical conductive block. As a result, the amount of the shift of the orbit can be reduced.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a partial cross-sectional view showing an example of an electron beam exposure system according to the present invention;

FIG. 2 is a view showing an example of the result of a simulation calculation of the relationship between a supply voltage to an electrical conductive block and an amount of shift of an electron beam arrival position;

FIG. 3 is a view showing the position of the electrical conductive block in an experiment for obtaining the relationship between the supply voltage to the electrical conductive block and the amount of shift of the electron beam arrival position;

FIG. 4 is a partial cross-sectional view showing other example of the electron beam exposure system;

FIG. 5 is a partial cross-sectional view showing other.example of the electron beam exposure system;

FIG. 9 is a partial cross-sectional view showing other example of the electron beam exposure system;

FIG. 10 is a partial cross-sectional view showing other example of the electron beam exposure system;

DETAILED DESCRIPTION OF THE INVENTION

Figure 6:
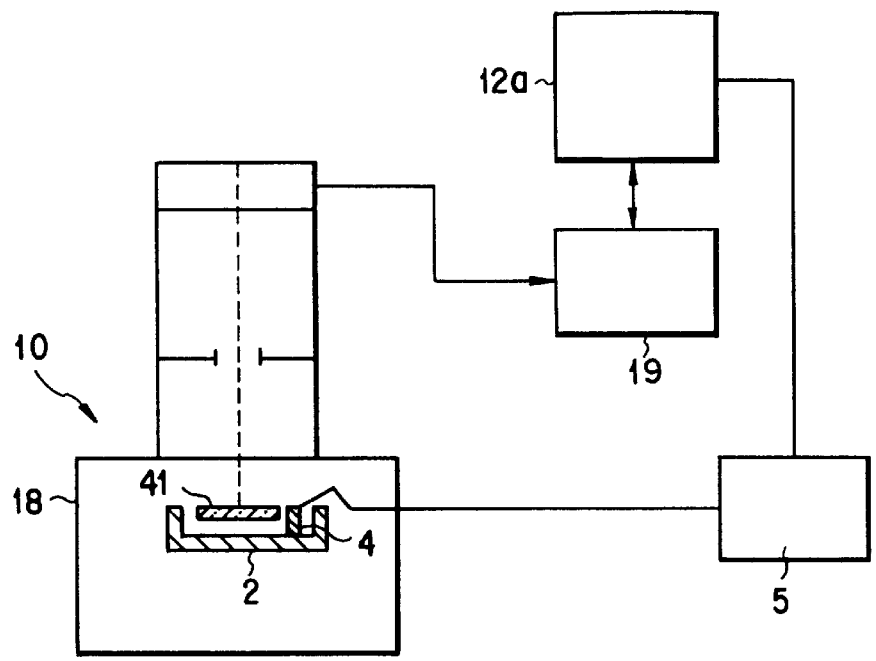
FIG. 6 is a partial cross-sectional view showing other example of the electron beam exposure system.

The following will explain embodiments of the present invention with reference to the accompanying drawings.

EXAMPLE 1

FIG. 1 shows a schematic view of an embodiment of an electron beam exposure system according to the present invention.

A glass substrate 1 is set in a holder 2 of the electron beam exposure system. A Cr film 7 is deposited on a surface of the glass substrate 1, and the resultant surface is coated with photoresist, which is a non-conductor. The holder 2 has a block 4, made of an electrical conductive material, to cover the upside of a peripheral portion along the periphery of the glass substrate 1. The electrical conductive block 4 is attached to the holder 2 with a dielectric block. The electrical conductive block 4 is connected to a DC power supply unit 5 provided outside of the holder 2.

When the glass substrate 1 is irradiated with an electron beam, an electric potential is generated on a surface of a photoresist film 8. The electric potential can be expressed by an equation as shown in, e.g., M. A. Sturans et al. (SPIE Vol. 1604, pp.36–44, 1991);

$$V_s = \eta i t \delta / 2 \epsilon \epsilon_0 \tag{1}$$

wherein Vs: an electric potential of the surface of the photoresist film, $\eta$: a contribution rate to charge-up, i: current density of a beam, t: beam irradiation period, $\delta$: a thickness of the photoresist film, $\epsilon$: permittivity, and $\epsilon_0$: a relative permittivity.

The arrival position of the electron beam, which passes in the vicinity of the electrical conductive block 4, is shifted by influence of an electric field generated by an electric potential difference between the surface of the photoresist film 8 and the electrical conductive block 4. An amount of shift of the arrival position of the electron beam can be obtained by a simulation calculation using the electric potential Vs of the surface of the photoresist film 8 obtained by the above-mentioned way. FIG. 2 shows an example of the calculation result of a shift length of the electron beam in a condition that a voltage (V1 to V5) to be supplied to the electrical conductive block 4 is used as a parameter. From FIG. 2, it is understandable that a suitable electric potential V4 is supplied to the electrical conductive block 4 so that the shift of the electron beam becomes minimum.

Since the electrical conductive block 4 is positioned to cover the upside of the peripheral portion of the glass substrate 1, a secondary electron does not arrive on the peripheral portion, and the charge-up at the peripheral portion is prevented at the same time.

An experiment for obtaining the relationship between the voltage to be supplied to the electrical conductive block 4 and the amount of shift of the arrival position of the electron beam was conducted by use of the electron beam exposure system having the structure of FIG. 1. In FIG. 3, there is shown a condition of the arrangement of the electrical conductive block 4 at the time of the experiment. As shown in FIG. 3, the electrical conductive block 4 had a thickness of 5 mm. Then, the electrical conductive block 4 is arranged to cover a portion having a width of 4 mm along the periphery of a processing photoplate 41. A distance from the surface of the photoplate 41 to the electrical conductive block 4 was 0.5 mm. Under this condition, a point of an inner side from the edge of the photoplate 41 by 12.6 mm was set as a target, a pattern is drawn, and the amount of shift of the arrival portion of the electron beam was measured. In this case, an accelerating voltage of the electron beam was 15 kV, current density was 8.7 A/cm$^2$, irradiating period was 1 $\mu$sec, and the thickness of the photoresist was 0.5 $\mu$m. Then, the following result was obtained by this experiment. When the voltage applied to the electrical conductive block 4 was 0 V, the pattern was shifted to the outer side by 0.06 $\mu$m. When the voltage applied to the electrical conductive block 4 was –5 V, the pattern was shifted to the inner side by 0.23 $\mu$m.

From the above result, it is understandable that about the voltage of –1.0 V may be applied to the electrical conductive block 4 to obtain the shift of zero.

Also, from the above result, it was confirmed that the necessary voltage to be applied to the electrical conductive block 4 was only several voltages even in a case that the accelerating voltage of the electron beam was further increased.

EXAMPLE 2

FIG. 4 shows a schematic view of the other example of the electron beam exposure system according to the present invention.

In this example, the block 4, made of the electrical conductive material, is positioned at the outer side of the glass substrate 1 along the periphery of the glass substrate 1. An upper surface of the block 4 is positioned to be the same level as the surface of the glass substrate 1. The electrical conductive block 4 is attached to the holder 2 with the dielectric block 3, and connected to the DC power supply unit 5. Even in this example, the electric potential is generated on the surface of the photo-resist film 8 by irradiation of the electron beam. However, a suitable electric potential (e.g., substantially the same voltage applied to the surface of the photoresist film) is supplied to the electrical conductive block 4 so that the shift of the electron beam becomes minimum.

Since the electrical conductive block 4 is positioned in the vicinity of the periphery of the substrate 1, a secondary electron does not arrive on the peripheral portion, and the charge-up at the peripheral portion is prevented at the same time.

EXAMPLE 3

FIG. 5 shows a schematic view of the other example of the electron beam exposure system according to the present invention.

To set the glass substrate 1 in the holder 2, there is used a method in which the glass substrate 1 is pushed up by coil springs 6 such that the surface of the glass substrate 1 contacts with a lower surface of a standard block 51, which is made of electrical conductive material. It looks as if the standard block 51 had the same effect as the electrical conductive block 4 of FIG. 1. However, since the standard block 51 is electrically contacted with the holder 2 and the photoresist film 8, no voltage can be supplied to the standard block 51 from the outer portion.

As shown in FIG. 5, the electrical conductive block 4 is attached to the holder 2 with a dielectric block 3a. Moreover, a dielectric block 3b is arranged at a portion where the glass substrate 1 contacts with the block 4. Then, the glass substrate 1 is fixed in a state that the glass substrate 1 is insulated from the block 4. Furthermore, the block 4 is connected to the DC power supply unit 5 provided at the outer portion. The voltage to be supplied to the block 4 is suitably adjusted in accordance with the electric potential on the surface of the photoresist film 8 generated by irradiation of the electron beam. As a result, similar to the example of FIG. 1, the shift of the electron beam can be minimized.

Even in the above-mentioned structure, the secondary electron does not arrive on the peripheral portion of the glass substrate 1 and the dielectric block 3b.

EXAMPLE 4

FIG. 6 shows a schematic view of the other example of the electron beam exposure system according to the present invention.

A processing substrate 41 is set in a specimen chamber 18 of an electron beam exposure system 10. An irradiation condition of the electron beam is controlled by a pattern writing control processor 18. An optimum value of the voltage to be supplied to the block 4 arranged in the vicinity of the periphery of the processing substrate 41 depends on the irradiation condition of the electron beam, that is, irradiation energy, and a writing pattern. Due to this, the optimum value of the voltage to be supplied is calculated in accordance with the pattern writing condition by a voltage control unit 12a. Then, if the resultant voltage is supplied to the electrical conductive block 4 from the DC power supply unit 5, the correction of the shift of the electron beam can be achieved more accurately.

EXAMPLE 5

Figure 7:
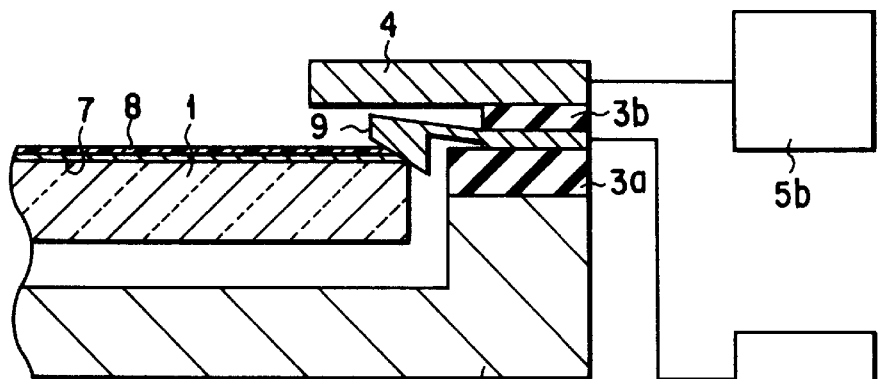
FIG. 7 is a partial cross-sectional view showing other example of the electron beam exposure system.

FIG. 7 shows a schematic view of the other example of the electron beam exposure system according to the present invention.

The Cr film 7 is electrically connected to the outer portion to let the electron arrived on the Cr film 7 free to the outer portion of the substrate 1 during the electron beam exposure. More specifically, an earth knife 9, which is made of an electrical conductive material, is attached to the holder 2 with the dielectric block 3a. The earth knife 9 is connected to a DC power supply unit 5a arranged at the outer portion of the holder 2. The earth knife 9 is brought in contact with the Cr film 7 at the periphery of the glass substrate 1, and the Cr film 7 is connected to the DC power supply unit 5a. As a result, the charge-up can be prevented.

The portion where the earth knife 9 is provided is only a part of the surface of the glass substrate 1. Due to this, the electrical field of the peripheral portion of the glass substrate 1 is abruptly changed in the vicinity of the earth knife 9, so that the shift of the electron beam is increased. To solve this problem, the block 4, which is made of an electrical conductive material, is arranged above the peripheral portion along the periphery of the glass substrate 1. Then, the upside of the earth knife 9 is also covered with the block 4. The block 4 is attached to the holder 2 with a dielectric block 3b, and is connected to a DC power supply unit 5a arranged at the outer portion of the holder 2. As a result, influence of the variation of the electric field, which is generated by the earth knife 9, can be removed.

In this case, the voltage can be independently supplied to each of the electrical conductive block 4 and the earth knife 9. The electric potential is generated on the surface of the photoresist film 8 by irradiation of the electron beam. However, similar to the example of FIG. 1, the shift of the electron beam can be minimized by supplying an appropriate voltage to the electrical conductive block 4. Moreover, since an arbitrary electric potential can be set to the Cr film 7 through the earth knife 9, the same effect as the case when the Cr film 7 is grounded can be obtained when the setting voltage is 0. Furthermore, if the voltage to be supplied to the earth knife 9 is suitably adjusted, the electric field can be more precisely formed such that the shift of the electron beam can be minimized.

EXAMPLE 6

Figure 8:
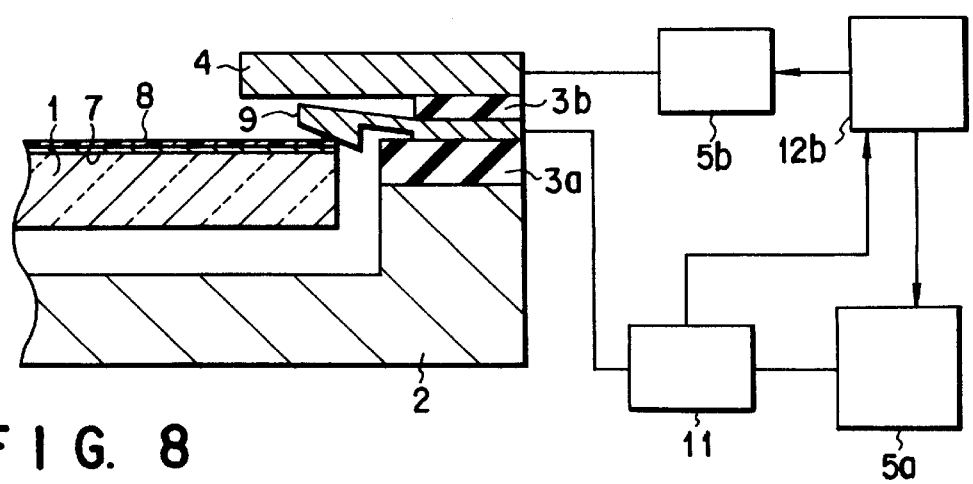
FIG. 8 is a partial cross-sectional view showing other example of the electron beam exposure system.

FIG. 8 shows a schematic view of the other example of the electron beam exposure system according to the present invention.

The block 4, which is made of an electrical conductive material, is positioned to cover the upside of the peripheral portion along the periphery of the glass substrate 1. The electrical conductive block 4 is attached to the holder 2 with the dielectric block 3b, and is connected to the DC power supply unit 5b provided in the outer portion of the holder 2.

In this example, in addition to the electrical conductive block 4, the earth knife 9 is attached to the holder 2 with the dielectric block 3a to come in contact with the Cr film 7 at the peripheral portion of the glass substrate 1. The earth knife 9 is connected to the DC power supply unit 5a through a current measurement unit 11. Moreover, there is provided a voltage control unit 12b for controlling a voltage applied to the earth knife 9 from the DC power supply unit 5a and a voltage applied to the electrical conductive block 4 from the DC power supply unit 5b, based on a value of an earth current measured by the current measurement unit 11.

When the substrate is irradiated with the electron beam, the electric potential is generated on the surface of the photoresist 8 and the earth current caused by the electron beam flows to the DC power supply unit 5a through the earth knife 9. The earth current is measured by the current measurement unit 11. Based on the measured value of the earth current, optimum voltages to be supplied to the earth knife 9 and the electrical conductive block 4 are calculated by a voltage control unit 12b. Then, the calculated voltages are supplied to the earth knife 9 and the electrical conductive block 4 respectively. As a result, the shift of the electron beam can be minimized.

EXAMPLE 7

FIG. 9 shows a schematic view of the other example of the electron beam exposure system according to the present invention.

The block 4, made of an electrical conductive material, is positioned to cover the upside of the peripheral portion along the periphery of the glass substrate 1. The electrical conductive block 4 is attached to the holder 2 through the dielectric block 3b, and is connected to the DC power supply unit 5b provided in the outer portion of the holder 2.

In this example, in addition to the electrical conductive block 4, the earth knife 9 is attached to the holder 2 with the dielectric block 3a to come in contact with the Cr film 7 at the peripheral portion of the glass substrate 1. The earth knife 9 is connected to the DC power supply unit 5a. Moreover, there is provided a reflection electron energy detector 14 for detecting a reflection electron energy, which is generated when electron beam is irradiated on the surface of the substrate during pattern writing.

When the substrate is irradiated with an electron beam 13, the electric potential is generated on the surface of the photoresist 8 and the reflection electron is generated. Then, energy of the reflection electron is detected by the reflection electron energy detector 14. Based on-the-detected value of energy, optimum voltages to be supplied to the earth knife 9 and the electrical conductive block 4 are calculated by a voltage control unit 12c. Then, the calculated voltages supplied to each of the earth knife 9 and the electrical conductive block 4. As a result, the shift of the electron beam can be minimized. As means for detecting energy of the electron beam, there can be used a method other than the detection of energy of the reflection electron.

EXAMPLE 8

FIG. 10 shows a schematic view of the other example of the electron beam exposure system according to the present invention.

An XY stage 15 is provided in the specimen chamber 18 of the electron beam exposure system 10, and the holder 2 is fixed onto the XY stage 15. The object plate 41 is set in the holder 2. The block 4, made of an electrical conductive material, is arranged around the object plate 41. The block 4 is connected to the DC power supply unit 5b. And the surface of the object block 4 is connected to DC power supply unit 5b through the earth knife (not shown). By moving the XY stage 15, a pattern is drawn on the object plate 41. Optimum voltages, which are applied to the block 4 and the surface of the object plate 41, is changed by pattern writing coordinates. The position of the XY stage 15 is measured by a position measurement unit 16. In accordance with the obtained pattern writing coordinates, the optimum voltages are instructed to the DC power supply units 5a and 5b from the voltage control unit 12d. Thereby, the correction of the shift of the electron beam can be achieved more accurately.

EXAMPLE 9

Figure 11:
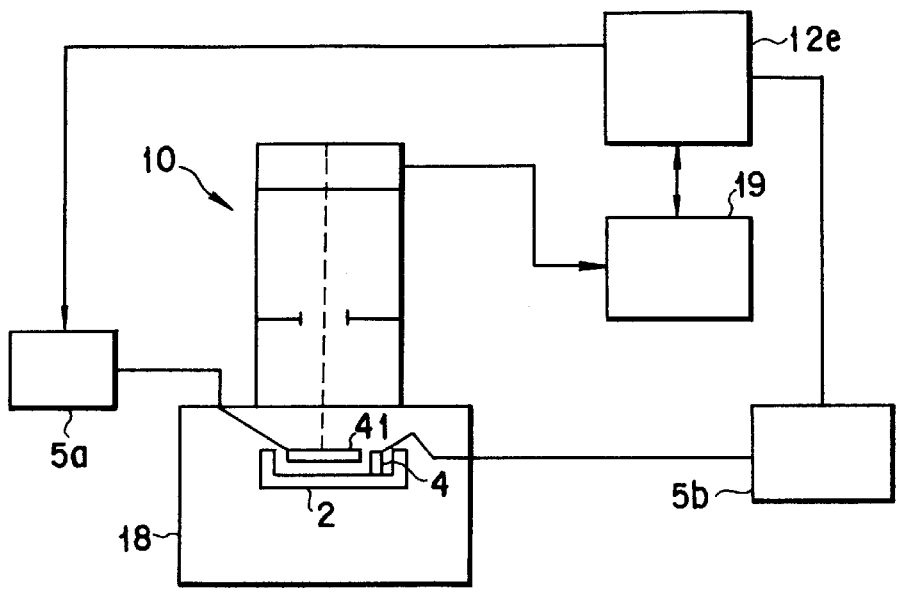
FIG. 11 is a partial cross-sectional view showing other example of the electron beam exposure system.

FIG. 11 shows a schematic view of the other example of the electron beam exposure system according to the present invention.

The object plate 41 is set in the specimen chamber 18 of the electron beam exposure system 10. The irradiation condition of the electron beam is controlled by the pattern writing control processor 19. The optimum value of the voltage to be supplied to the electrical conductive block 4, which is arranged in the vicinity of the periphery of the object plate 41, and that of the voltage to be supplied to the surface of the object plate depend on the irradiation condition of the electron beam, that is, irradiation energy and the writing pattern. Due to this, the optimum values of the voltage to be supplied are calculated in accordance with the pattern writing condition by a voltage control unit 12e. Then, the obtained voltages are supplied to the surface of the object plate 41 and the electrical conductive block 4 from the DC power supply unit 5, respectively. Thereby, the correction of the shift of the electron beam can be achieved more accurately.

EXAMPLE 10

Figure 12:
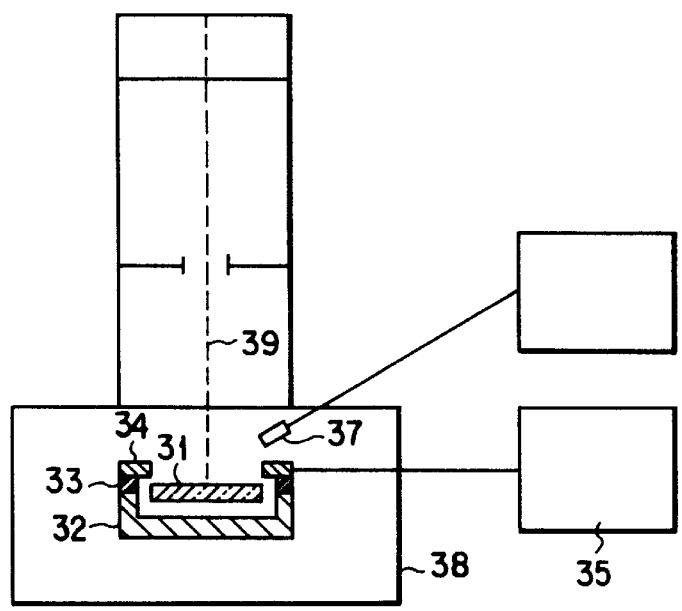
FIG. 12 is a schematic view of SEM (Scanning Electron Microprobe) according to the present invention.
Figure 13:
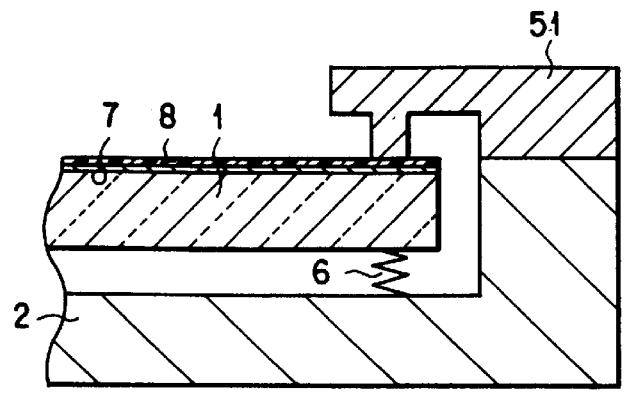
FIG. 13 is a partial cross-sectional view showing one example of a method for holding a photo plate in a conventional electron beam expose system.

FIG. 12 shows a schematic view of SEM (Scanning Electron Microprobe) based on the present invention.

A flat-plate specimen 31 is set in a holder 32 of a specimen chamber 31. On the holder 32, an electrical conductive block 34 is arranged to cover the upside of the peripheral portion along the periphery of the specimen 31. The electrical conductive block 34 is attached to the holder 32 with a dielectric block 33. A DC voltage is supplied to the electrical conductive block 34 from a DC power supply unit 35, which is provided at the outside of the specimen chamber 38.

The surface of the specimen is irradiated with an electron beam 39 as scanning so that a generating secondary electron is captured by a secondary-electron multiplier 37. Thus, the state of the surface of the specimen can be observed. The amount of the charge-up, which occurs in accordance with the irradiation of the electron beam 39, is not the same at the peripheral portion of the specimen and the central portion. Because of the difference in the amount of the chargeup, an inclination of the electric potential occurs in the direction parallel to the surface of the specimen 31. By the inclination of the electric potential, an orbit of the electron beam 39 is shifted. Then, a suitable electric potential is set to the electrical conductive block 34, which is arranged in the vicinity of the periphery of the specimen 31. Thereby, the shift of the orbit of the electron beam 39 can be corrected.

The above-explained systems and the methods are not limited to the exposure systems using the electron beam. The present invention can be used in an exposure system using charged particle such as an ion beam.

As explained above, according to the present invention, at the time when the substrate is irradiated with the electron beam as scanning to draw the pattern, the electrical conductive block is arranged in the vicinity of the periphery of the substrate, and a suitable voltage is supplied to the electrical conductive block. Thereby, the electric field can be formed to be uniformly over the entire surface of the substrate and to have an electric potential inclination which is parallel to the incident direction of the electron beam. As a result, the shift of the electron beam can be reduced, and the pattern can be drawn at high accuracy.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A charged particle beam exposure system comprising:
   a holder for holding a substrate;
   a beam source for emitting a charged particle beam onto a surface of said substrate;
   beam scanning means for scanning said charged particle beam to draw a pattern on the surface of said substrate;
   an electrical conductive block provided in the vicinity of a periphery of said substrate to be electrically insulated from said substrate; and
   a DC power supply unit for supplying an arbitrary voltage to said electrical conductive block;
   wherein said electrical conductive block is arranged to cover upside of the peripheral portion along the periphery of said substrate, and to be attached to said holder as being electrically insulated from said holder.

2. A charged particle beam exposure system comprising:
   a holder for holding a substrate;
   a beam source for emitting a charged particle beam onto a surface of said substrate;
   beam scanning means for scanning said charged particle beam to draw a pattern on the surface of said substrate;
   an electrical conductive block provided in the vicinity of a periphery of said substrate to be electrically insulated from said substrate; and
   a DC power supply unit for supplying an arbitrary voltage to said electrical conductive block;
   wherein said electrical conductive block is arranged at the outer side of the periphery of said substrate along the periphery, and to be attached to said holder as being electrically insulated from said holder, and an upper surface of said electrical conductive block is positioned to have the same level as an upper surface of said substrate.

3. The charged particle beam exposure system according to claim 1 or 2, further comprising:
   voltage controlling means for controlling a voltage supplied to said electrical conductive block in accordance with an irradiation condition of the charged particle beam.

4. A charged particle beam exposure system comprising:
   a holder for holding a substrate;
   a beam source for emitting a charged particle beam onto a surface of said substrate;
   beam scanning means for scanning said charged particle beam to draw a pattern on the surface of said substrate;
   a first electrical conductive block coming in electrical contact with a surface of a peripheral portion of said substrate;
   a first DC power supply unit for supplying an arbitrary voltage to said first electrical conductive block;
   a second electrical conductive block arranged to cover upside of said first electrical conductive block and upside of a peripheral portion along the periphery of said substrate, and to be electrically insulated from said substrate; and
   a second DC power supply unit for supplying the other arbitrary voltage to said second electrical conductive block.

5. The charged particle beam exposure system according to claim 4, wherein said first and second electrical conductive blocks are attached to said holder as being electrically insulated from said holder.

6. The charged particle beam exposure system according to claim 4 or 5, further comprising:
   a current measurement unit for measuring a current flowing from said first electrical conductive block to said DC power supply unit; and
   voltage controlling means for independently controlling voltages supplied to said first and second electrical conductive blocks based on the measured value of the current by said current measurement unit.

7. The charged particle beam exposure system according to claim 4 or 5, further comprising:
   measuring means for measuring energy of the charged particle beam irradiated onto said substrate; and
   voltage controlling means for independently controlling voltages supplied to said first and second electrical conductive blocks based on the measured value of energy of the charged particle beam by said measuring means.

8. The charged particle beam exposure system according to claim 4 or 5, further comprising:
   a moving stage having said holder attached thereto;
   position measuring means for measuring a position of said moving stage; and
   voltage controlling means for independently controlling voltages supplied to said first and second electrical conductive blocks based on the measured value of the position of said moving stage by said measuring means.

9. The charged particle beam exposure system according to claim 4 or 5, further comprising:
   voltage controlling means for independently controlling voltages supplied to said first and second electrical conductive blocks in accordance with an irradiation condition of said charged particle beam.

10. A method for exposing a charged particle beam comprising the steps of:
    arranging a first electrical conductive block on a surface of a peripheral portion of a substrate to be electrically contacted and a second electrical conductive block to cover upside of said first electrical conductive block and upside of the peripheral portion along the periphery of said substrate in advance; and
    emitting a charged particle beam onto a surface of said substrate as scanning in a state that a voltage is supplied to said electrical conductive block such that an electric potential inclination in the vicinity of the surface of said substrate becomes parallel to a direction of the charged particle beam, thereby drawing a pattern on the surface of said substrate.

* * * * *